United States Patent [19]

Hiroshima et al.

[11] Patent Number: 4,473,891

[45] Date of Patent: Sep. 25, 1984

[54] MAGNETIC BUBBLE MEMORY DEVICE

[76] Inventors: Minoru Hiroshima, 3550, Hayano; Shinzo Matsumoto, 460, Shimonagayoshi, both of Mobara-shi, Chiba-ken, Japan

[21] Appl. No.: 439,808

[22] Filed: Nov. 8, 1982

[30] Foreign Application Priority Data

Nov. 11, 1981 [JP] Japan ............................... 56-179697

[51] Int. Cl.[3] ............................................ G11C 19/08

[52] U.S. Cl. ........................................ 365/15; 365/43

[58] Field of Search ....................... 365/15, 39, 42, 43, 365/44

[56] References Cited

PUBLICATIONS

Microelectronics-vol. 8, No. 2; 1977, pp. 9-12.

*Primary Examiner*—James W. Moffitt

*Attorney, Agent, or Firm*—Charles E. Pfund

[57] ABSTRACT

In a magnetic bubble memory device comprising a number of magnetic bubble propagation paths each including magnetic bubble propagation bit segments arrayed in the direction of propagation of magnetic bubbles, the propagation paths being arranged in the direction perpendicular to the propagation direction of magnetic bubbles, $d/\lambda_x$ is set to less than 0.2, where $\lambda_x$ is the period of arrangement of the magnetic bubble propagation paths and d is the distance between close adjoining magnetic bubble propagation bit segments of adjacent magnetic bubble propagation paths.

3 Claims, 10 Drawing Figures

MAGNETIC BUBBLE MEMORY DEVICE

BACKGROUND OF THE INVENTION

This invention relates to a magnetic bubble memory device and, more particularly, to an improvement in the magnetic bubble propagation path suitable for high density magnetic bubble memory devices.

In the past, in order to make magnetic bubble propagation bit segments adaptive for high density magnetic bubble memory devices of several Mb (mega bits), these segments were simply reduced in size in proportion to increase in density of the device. As a result, the surface area of the bit segments became too small to produce sufficient magnetic bubble driving force and proper and stable propagation of magnetic bubbles through the magnetic bubble propagation bit segments was prevented.

SUMMARY OF THE INVENTION

The invention has, in the light of the above drawbacks inherent in the prior art, as its principal object to provide a magnetic bubble propagation path adapted for high density magnetic bubble memory devices which permits stable propagation of magnetic bubbles with increasing density of the magnetic bubble memory devices.

According to the invention, in a magnetic bubble memory device comprising a number of magnetic bubble propagation paths each including magnetic bubble propagation bit segments arrayed in the direction of propagation of magnetic bubbles, the propagation paths being arranged in the direction perpendicular to the propagation direction of magnetic bubbles, $d/\lambda_x$ is set to less than 0.2, where $\lambda_x$ is the period of arrangement of the magnetic bubble propagation paths and d is the distance between close adjoining magnetic bubble propagation bit segments of adjacent magnetic bubble propagation paths.

DESCRIPTION OF PREFERRED EMBODIMENTS

Figure 1:
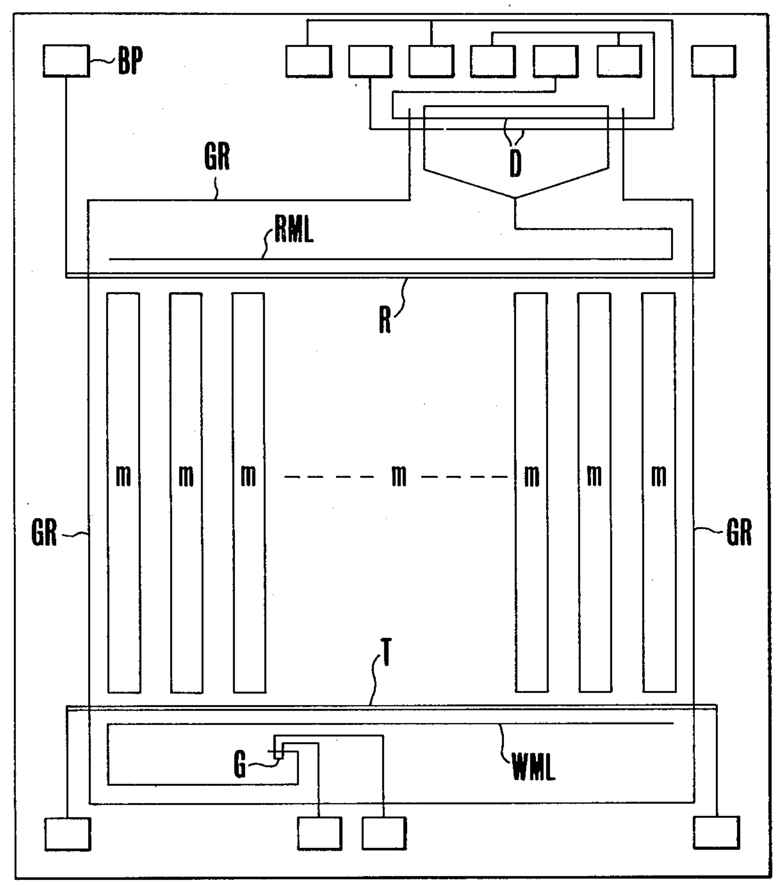
FIG. 1 is a schematic plan view showing an example of one arrangement of various basic elements in a magnetic bubble memory device.

On a chip of a magnetic bubble memory device are arranged various basic elements. FIG. 1 shows an example of such arrangement of basic elements. In FIG. 1, letter m denotes a minor loop which stores information, RML read major line to propagate the read-out information, and WML write major line to propagate the write-in information. Letter D denotes a bubble detector to convert magnetic bubbles to electric signals, G a bubble generator to generate magnetic bubbles, R a replicate gate circuit to replicate the information stored in the minor loop m to the read major line RML, and T is a swap gate circuit to exchange the information on the write major line WML and the information in the minor loop m. Letter GR denotes a guard rail encircling the outer periphery of all these parts to guard against the entry of the magnetic bubbles from the outside, and BP a bonding pad to supply the operating pulse current from an external source.

Among these basic elements, the minor loop has straight path portions and curved path portions for circulative propagation of magnetic bubbles, and the invention is applicable to such a magnetic bubble propagation path as the straight path portion of the minor loop.

Figures 2, 3, 4:
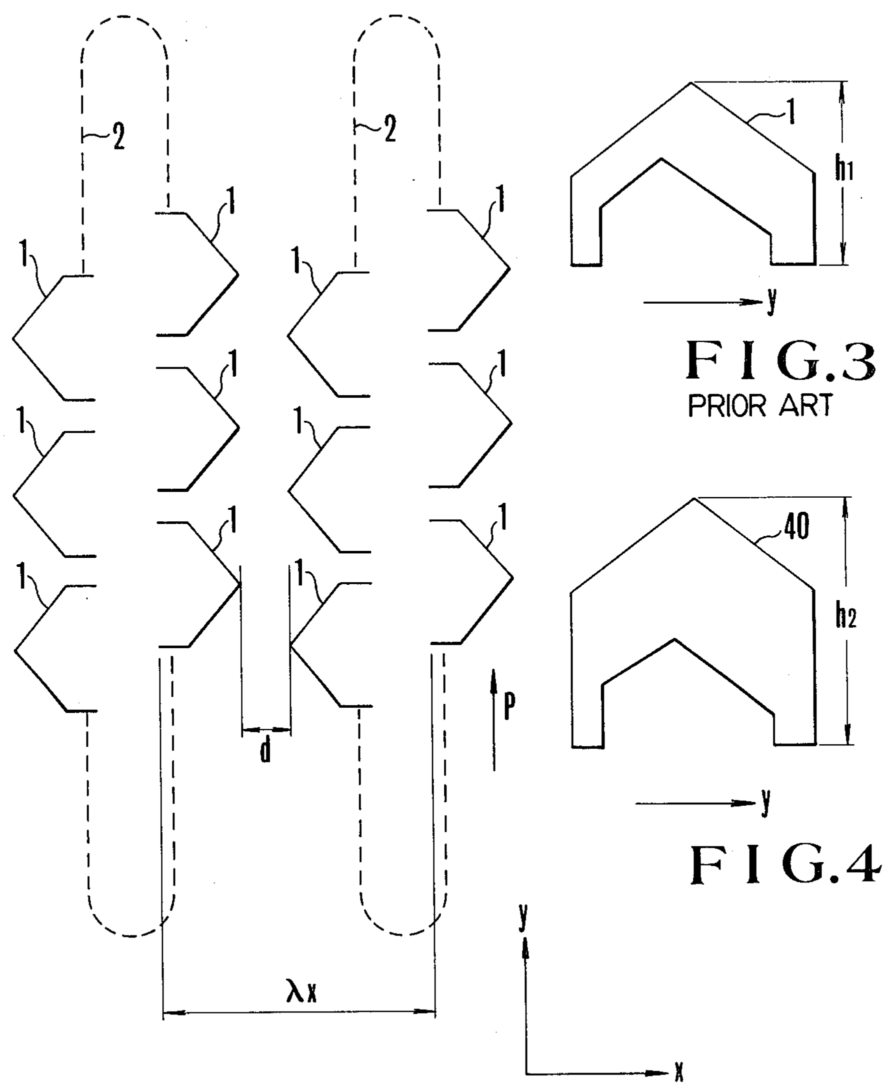
FIG. 2 is a fragmentary schematic plan view showing an example of arrangement of magnetic bubble propagation path in a prior art.
FIG. 3 is an enlarged plan view showing a prior art example of a magnetic bubble propagation bit segment.
FIG. 4 is an enlarged plan view showing an example of a magnetic bubble propagation bit segment used in a magnetic bubble memory device according to the invention.

In a prior art magnetic bubble memory device, a number of magnetic bubble propagation paths are arranged as schematically shown in FIG. 2 (only two paths are illustrated). Designated at 1 are magnetic bubble propagation bit segments each having an asymmetric chevron pattern having a height h1 as shown in an enlarged plan view in FIG. 3. A plurality of magnetic bubble propagation bit segments 1 in each path are arrayed in a direction P of propagation of magnetic bubbles (i.e., direction of y axis) at a predetermined interval or bit period. The period $\lambda_x$ of arrangement of minor loops 2 (i.e., period of repetition in the x axis direction) is selected to 6 to 10 times the diameter of the magnetic bubble used in the magnetic bubble memory device. The distance d between close adjoining magnetic bubble propagation bit segments 1 in straight path portions of adjacent minor loops 2 is set to about $$d \geqq 0.3\lambda_x.$$

Figure 5:
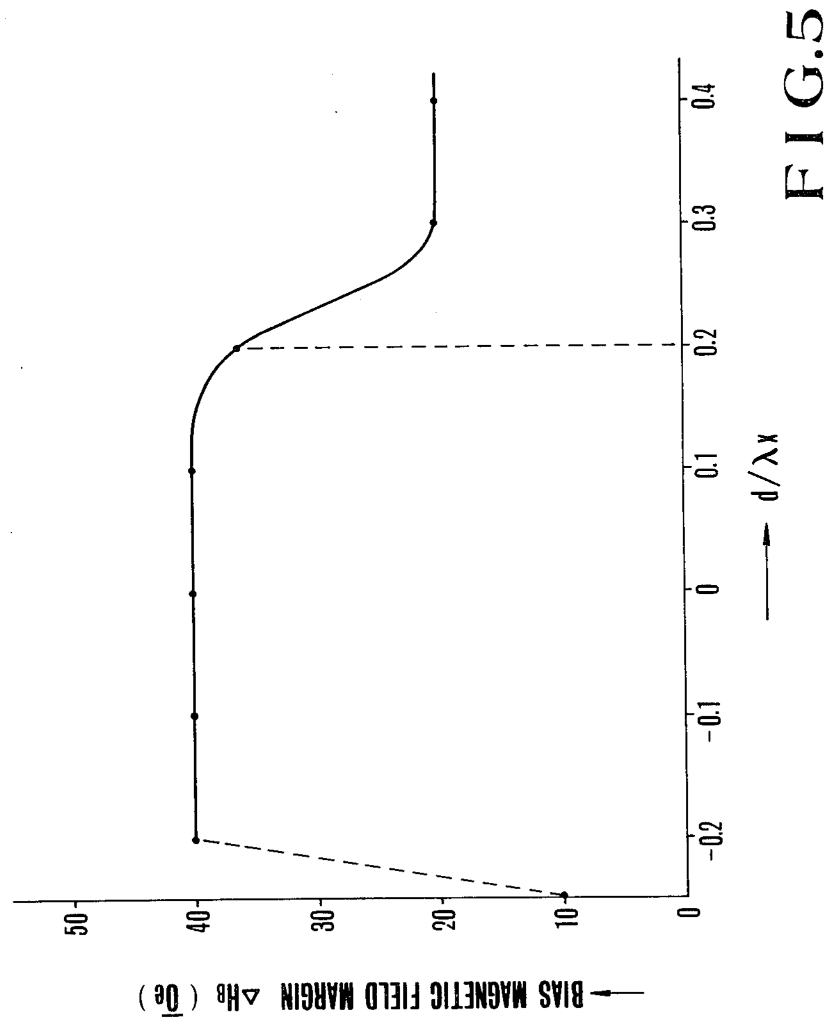
FIG. 5 is a graph showing the relation of bias magnetic field margin $\Delta H_B$ with respect to $d/\lambda_x$.

The inventors have repeatedly conducted varous experiments and researches, and have found that by increasing the height, h2, of the pattern of a magnetic bubble propagation bit segment 40 (h2>h1) to increase the surface area of the pattern as shown in FIG. 4, the distance d between the close adjoining magnetic bubble propagation bit segments in adjacent straight path portions can be reduced to reduce $d/\lambda_x$ so as to increase the bias magnetic field margin $H_B$. FIG. 5 shows experimental data of the magnetic bubble propagation characteristic obtained for various values of $d/\lambda_x$. When $d/\lambda_x$ is above 0.3 as in the prior art, the bias magnetic field margin $\Delta H_B$ is as small as about 20 Oe. This is because with this range of $d/\lambda_x$, the pattern height of the magnetic bubble propagation bit segment cannot be made sufficiently large. On the other hand, when $d/\lambda_x$ is reduced to be less than 0.2, the surface area of the magnetic bubble propagation bit segment can be increased to approximately double the bias magnetic field margin $\Delta H_B$.

According to the invention, the magnetic bubble propagation path arrangement is therefore formed such that $d/\lambda_x$ is less than 0.2. The invention will now be described in detail in conjunction with an embodiment thereof.

Figure 6:
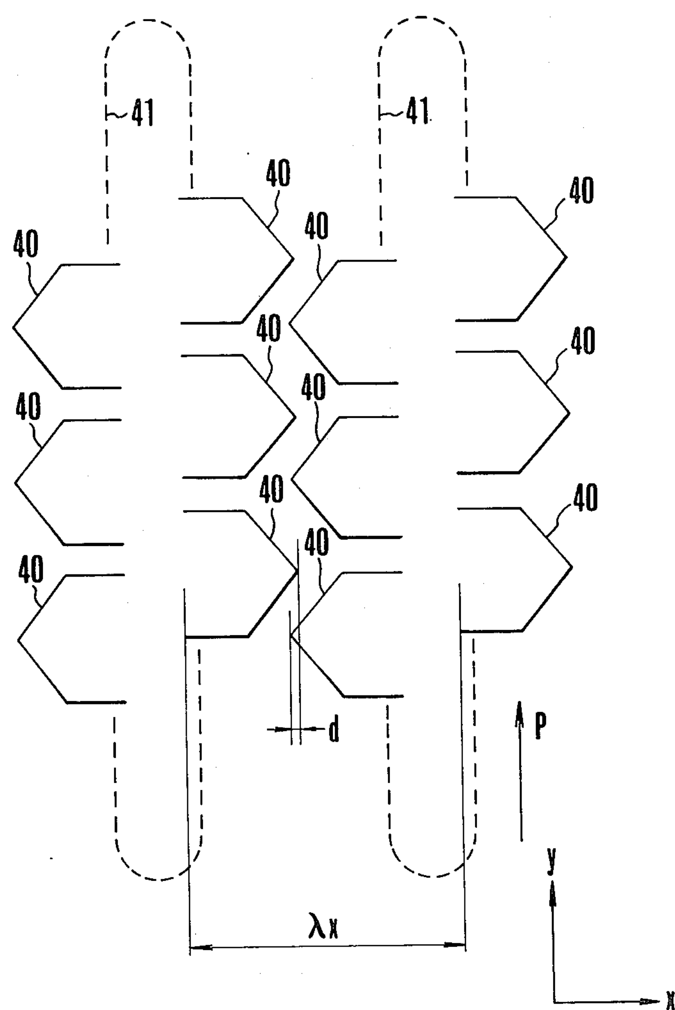
FIG. 6 is a fragmentary schematic plan view showing an example of arrangement of magnetic bubble propagation paths in a magnetic bubble memory device according to the invention; and FIGS. *7a* to *7d* are enlarged plan views showing different examples of the magnetic bubble propagation bit segment applicable to magnetic bubble propagation paths according to the invention.
Figure 7A:
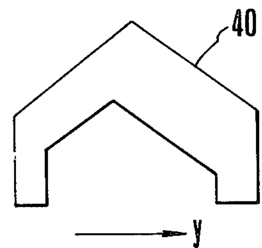
Figure 7B:
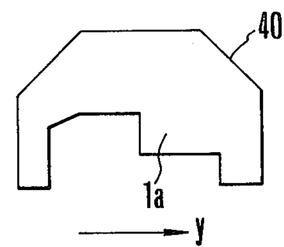
Figure 7C:
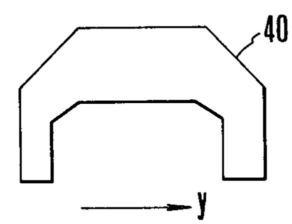
Figure 7D:
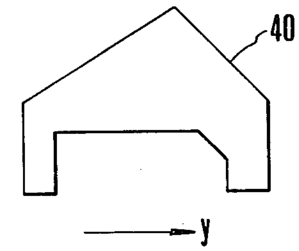

FIG. 6 is a schematic plan view showing an embodiment of the magnetic bubble propagation path according to the invention. In FIG. 6, designated at 40 are magnetic bubble propagation bit segments each having an asymmetric chevron pattern having an increased pattern surface area with a height h2 as shown in an enlarged plan view in FIG. 4. Each minor loop 41 has a straight path portion formed by a plurality of magnetic bubble propagation bit segments 40 arrayed in a direction P of propagation of magnetic bubbles (i.e., y axis direction) at a predetermined interval or bit pitch. The distance d between close adjoining magnetic bubble propagation bit segments 40 in straight path portions of adjacent magnetic bubble propagation paths is set to $d=-0.2\lambda_x$. That is, the top portions of the close adjoining magnetic bubble propagation bit segments 40 in the straight path portions of adjacent minor loops 41 overlap with each other. The interval $\lambda_x$ of arrangement of minor loops 2 (i.e., the repetition interval in the x axis direction) is of course set to 5 to 8 times the diameter of the magnetic bubble used.

With the above construction, since the distance d between close adjoining magnetic bubble propagation bit segments 40 in the adjacent straight path portions is set to a negative value of $d=-0.2\lambda_x$, the surface area of the magnetic bubble propagation bit segment 40 can be maximized. Thus, with an increased density of the magnetic bubble memory device, about 40 Oe of bias magnetic field margin can be obtained to permit stable propagation of magnetic bubbles.

Experiments conducted by the inventors prove that improved bias magnetic field margin can be obtained by setting $d/\lambda_x$ to be in a range of $-0.2\leqq d/\lambda_x\leqq 0.2$. If $d/\lambda_x$ departs from the range, the bias magnetic field margin is greatly reduced so that satisfactory results cannot be obtained. Very satisfactory results can be obtained by setting the distance d between adjacent segments 40 to be $d\leqq 0.2\lambda_x$.

While in the above embodiment the magnetic bubble propagation bit segment 40 has an asymmetric pattern as shown in FIG. *7a*, the same effects can of course be obtained by using a half disc pattern as shown in FIG. *7b* having a trapezoidal top portion and a projecting main portion bottom 1*a*, a symmetric half disc pattern as shown in FIG. *7c* having a trapezoidal top portion, a modified asymmetric chevron pattern as shown in FIG. *7d* having a trapezoidal top portion and a flat main portion bottom, or any modified pattern obtained as a combination of these patterns.

As has been described in the foregoing, with the magnetic bubble memory device according to the invention, a large area of the magnetic bubble propagation bit segment can be obtained with increasing density of the device so that is is possible to improve the bias magnetic field margin and obtained stable propagation of magnetic bubbles.

What is claimed is:

1. In a magnetic bubble memory device comprising a number of magnetic bubble propagation paths each including magnetic bubble propagation bit segments arrayed in the direction of propagation of magnetic bubbles, the propagation paths being arranged in the direction perpendicular to the propagation direction of magnetic bubbles, the improvement wherein $d/\lambda_x$ is set to be equal to or less than 0.2, where $\lambda_x$ is the period of arrangement of corresponding magnetic bubble propagation paths in adjacent minor loops and d is the distance in the direction of $\lambda x$ between close adjoining magnetic bubble propagation bit segments of contiguous magnetic bubble propagation paths in adjacent minor loops.

2. The magnetic bubble memory device according to claim 1, wherein $d/\lambda_x$ is set to be less than 0.2.

3. The magnetic bubble memory device according to claim 2 wherein $d/\lambda_x$ is negative such that the top portions of said close adjoining magnetic bubble propagation bit segments overlap.

* * * * *

UNITED STATES PATENT AND TRADEMARK OFFICE

CERTIFICATE OF CORRECTION

PATENT NO. : 4,473,891

DATED : September 25, 1984

INVENTOR(S) : Minoru Hiroshima and Shinzo Matsumoto

It is certified that error appears in the above-identified patent and that said Letters Patent is hereby corrected as shown below:

On the title page, insert --(73) Assignee: --Hitachi, LTD., Tokyo, Japan--.

Signed and Sealed this

*Seventeenth* Day of *September 1985*

[SEAL]

*Attest:*

DONALD J. QUIGG

*Attesting Officer*

*Commissioner of Patents and Trademarks—Designate*